United States Patent
Lin et al.

(10) Patent No.: US 12,334,392 B2
(45) Date of Patent: Jun. 17, 2025

(54) MULTI-HEIGHT INTERCONNECT TRENCHES FOR RESISTANCE AND CAPACITANCE OPTIMIZATION

(71) Applicant: Intel Corporation, Santa Clara, CA (US)

(72) Inventors: Kevin Lai Lin, Beaverton, OR (US);
Mauro Kobrinsky, Portland, OR (US);
Mark Anders, Hillsboro, OR (US);
Himanshu Kaul, Portland, OR (US);
Ram Krishnamurthy, Portland, OR (US)

( * ) Notice: Subject to any disclaimer, the term of this patent is extended or adjusted under 35 U.S.C. 154(b) by 1102 days.

(21) Appl. No.: 16/534,063

(22) Filed: Aug. 7, 2019

(65) Prior Publication Data

US 2021/0043500 A1 Feb. 11, 2021

(51) Int. Cl.
*H01L 21/768* (2006.01)
*H01L 23/528* (2006.01)
*H01L 23/522* (2006.01)

(52) U.S. Cl.
CPC .... *H01L 21/76816* (2013.01); *H01L 23/5283* (2013.01); *H01L 23/5226* (2013.01)

(58) Field of Classification Search
CPC ......... H01L 21/76816; H01L 21/76877; H01L 23/5226
See application file for complete search history.

(56) References Cited

U.S. PATENT DOCUMENTS

| | | | | |
|---|---|---|---|---|
| 6,100,177 A | * | 8/2000 | Noguchi | H01L 21/76808 438/638 |
| 7,589,398 B1 | * | 9/2009 | Huemoeller | H01L 21/4846 174/262 |
| 2001/0041436 A1 | * | 11/2001 | Parikh | H01L 21/76808 257/E21.579 |
| 2003/0209779 A1 | * | 11/2003 | Yu | H01L 21/76807 257/E23.152 |
| 2005/0054195 A1 | * | 3/2005 | Handa | H01L 21/76834 257/E21.585 |
| 2011/0101538 A1 | * | 5/2011 | Ponoth | H01L 21/768 257/E21.585 |
| 2012/0175733 A1 | * | 7/2012 | Kastenmeier | H01L 23/5223 257/532 |
| 2014/0001638 A1 | * | 1/2014 | Fu | H01L 21/768 257/E23.079 |
| 2015/0179515 A1 | * | 6/2015 | Jezewski | H01L 23/528 257/774 |
| 2015/0262873 A1 | * | 9/2015 | Chu | H01L 23/53295 257/773 |
| 2016/0307852 A1 | * | 10/2016 | Shih | H01L 23/5329 |
| 2017/0345918 A1 | * | 11/2017 | Iucolano | H01L 29/402 |
| 2019/0157150 A1 | * | 5/2019 | Park | H01L 23/5226 |
| 2020/0027780 A1 | * | 1/2020 | Briggs | H01L 21/76879 |
| 2020/0328155 A1 | * | 10/2020 | Schultz | H01L 21/7682 |
| 2021/0005548 A1 | * | 1/2021 | Lee | H01L 21/76832 |

* cited by examiner

*Primary Examiner* — Eric A. Ward
(74) *Attorney, Agent, or Firm* — Haley Guiliano LLP

(57) ABSTRACT

Embodiments disclosed herein include interconnect layers that include non-uniform interconnect heights and methods of forming such devices. In an embodiment, an interconnect layer comprises an interlayer dielectric (ILD), a first interconnect disposed in the ILD, wherein the first interconnect has a first height, and a second interconnect disposed in the ILD, wherein the second interconnect has a second height that is different than the first height.

18 Claims, 15 Drawing Sheets

MULTI-HEIGHT INTERCONNECT TRENCHES FOR RESISTANCE AND CAPACITANCE OPTIMIZATION

TECHNICAL FIELD

Embodiments of the present disclosure relate to semiconductor devices, and more particularly to interconnect layers with multi-height interconnect trenches.

BACKGROUND

In semiconductor dies, the signal paths between the transistor devices are made by interconnects. Depending on the complexity of the semiconductor die, there may be many interconnect layers. The resistance and capacitance are critical parameters that must be considered during the design of the signal paths. Resistance impacts the delay of a signal. For example, higher resistances have a longer delay. Capacitance impacts the power consumption. For example, higher capacitance increases the power consumption.

In electrical paths that are timing critical, the delay must be minimized. As such, a low resistance path is desired. Since the height of the interconnects within a layer are uniform, the only way to decrease resistance is to increase the width of the interconnect. However, this results in an area penalty. Additionally, since the heights of the interconnects within a layer are uniform, increasing the height of the interconnects globally to reduce resistance results in a significant increase in the capacitance. This reduces the power efficiency.

Accordingly, the routing path design must strike a balance between resistance and capacitance. The height of the interconnects may be increased to improve delay at the expense of power consumption, or the power consumption may be reduced at the expense of longer delays.

EMBODIMENTS OF THE PRESENT DISCLOSURE

Described herein are interconnect layers with multi-height interconnect trenches, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
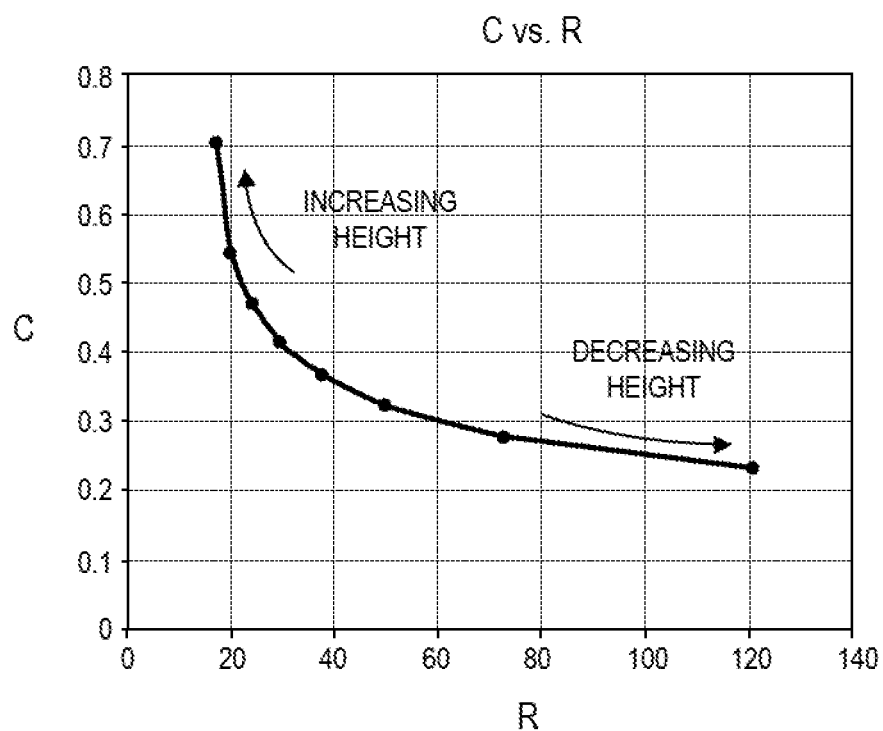
FIG. 1A is a graph of the capacitance versus resistance of interconnects in an interconnect layer, in accordance with an embodiment.

As noted above, decreasing the resistance of an interconnect results in an increase in the capacitance, assuming the critical dimensions and pitch is kept constant. Further, since existing interconnect layers only allow for interconnects of a single height, there is always a direct tradeoff between resistance and capacitance. This relationship is shown in the graph illustrated in FIG. 1A. As shown, interconnects with increasing height have lower resistance but higher capacitance, whereas interconnects with decreasing height have lower capacitance, but higher resistance.

Accordingly, embodiments disclosed herein include interconnect layers that include multi-height interconnects. This allows for the signal paths to be optimized for a given performance parameter. For example, signal paths that are delay critical may be routed along interconnects with a larger height, and the remainder of the signal paths may be routed along interconnects with a smaller height. This allows for signal delay metrics to be met while still maintaining power efficiency. Furthermore, since the resistance is decreased by increasing the height of the interconnect, there is no area penalty (as is the case when the width of the interconnect is increased). That is, the width of delay critical signal paths may be substantially the same as all other signal paths.

Figure 1B:
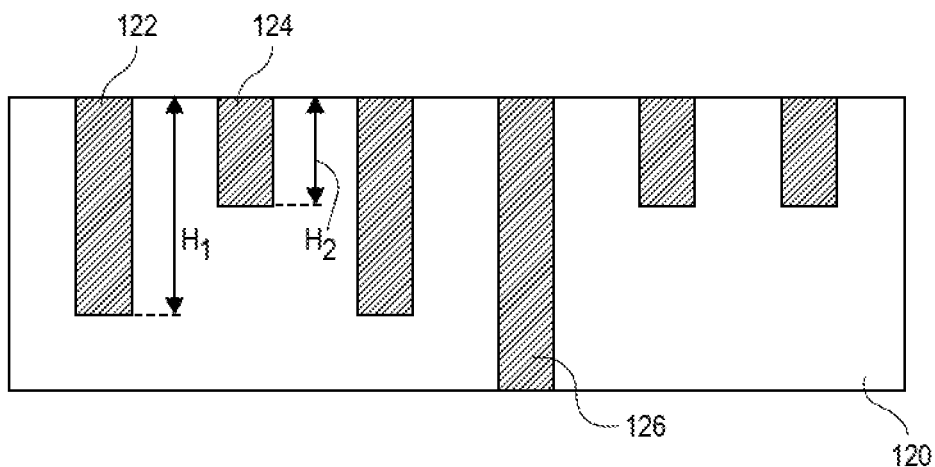
FIG. 1B is a cross-sectional illustration of an interconnect layer with first interconnects and second interconnects, in accordance with an embodiment.

Referring now to FIG. 1B, a cross-sectional illustration of an interconnect layer 100 is shown, in accordance with an embodiment. In an embodiment, the interconnect layer 100 is one interconnect layer 100 in a stack of interconnect layers (e.g., a back end of line (BEOL) stack). The interconnect layer 100 may be the first layer over the front end of line (FEOL) portion of a semiconductor substrate, or any other layer of the BEOL stack. In some embodiments, the interconnect layer 100 may be referred to as a "metal layer" (e.g., metal layer 1 (M1), metal layer 2 (M2), etc.). In an embodiment, the BEOL stack may comprise any number of interconnect layers 100, depending on the complexity of the device.

In an embodiment, the interconnect layer 100 may comprise an interlayer dielectric (ILD) 120. In an embodiment, as used throughout the present description, ILD material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, the interconnect layer 100 may comprise a plurality of interconnects 122/124. In an embodiment, the first interconnects 122 may have a first height $H_1$ and the second interconnects 124 may have a second height $H_2$. In an embodiment, the first height $H_1$ is different than the second height $H_2$. For example, the first height $H_1$ is shown as being greater than the second height $H_2$. The larger height $H_1$ provides a lower resistance to the first interconnects 122 compared to the second interconnects 124. The smaller height $H_2$ provides a lower capacitance to the second interconnects 124 compared to the first interconnects 122. Accordingly, chip designers are free to optimize routing paths for both low power consumption and high performance (e.g., low signal delay).

In an embodiment, the first interconnects 122 and the second interconnects 124 may have top surfaces that are substantially coplanar with each other. For example, the top surfaces of the first interconnects 122 and the second interconnects 124 may both be substantially coplanar with a top surface of the ILD 120. Accordingly, due to the difference in heights $H_1$ and $H_2$, the bottom surfaces of the first interconnects 122 and the second interconnects 124 are located at different Z-heights within the ILD 120.

In an embodiment, the first interconnects 122 and the second interconnects 124 may have substantially uniform widths. Accordingly, the decrease in the resistance of the first interconnects 122 does not come at the cost of an area penalty, as is the case described above. Accordingly, fine pitch high density interconnects may still be maintained even at lower interconnect layers (e.g., M1, M2, etc.).

In an embodiment, the interconnect layer 100 may also include one or more vias 126. The vias 126 may pass through to the bottom of the interconnect layer 100. It is to be appreciated that the vias 126 may be connected to bottom surfaces of either first interconnects 122 or second interconnects 124. That is, the vias 126 may also have a non-uniform height within an interconnect layer 100. For example, a via 126 attached to a first interconnect 122 may be shorter than a via 126 attached to a second interconnect 124.

In an embodiment, as is also used throughout the present description, metal lines or interconnect line material (and via material) are composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

Figure 2A:
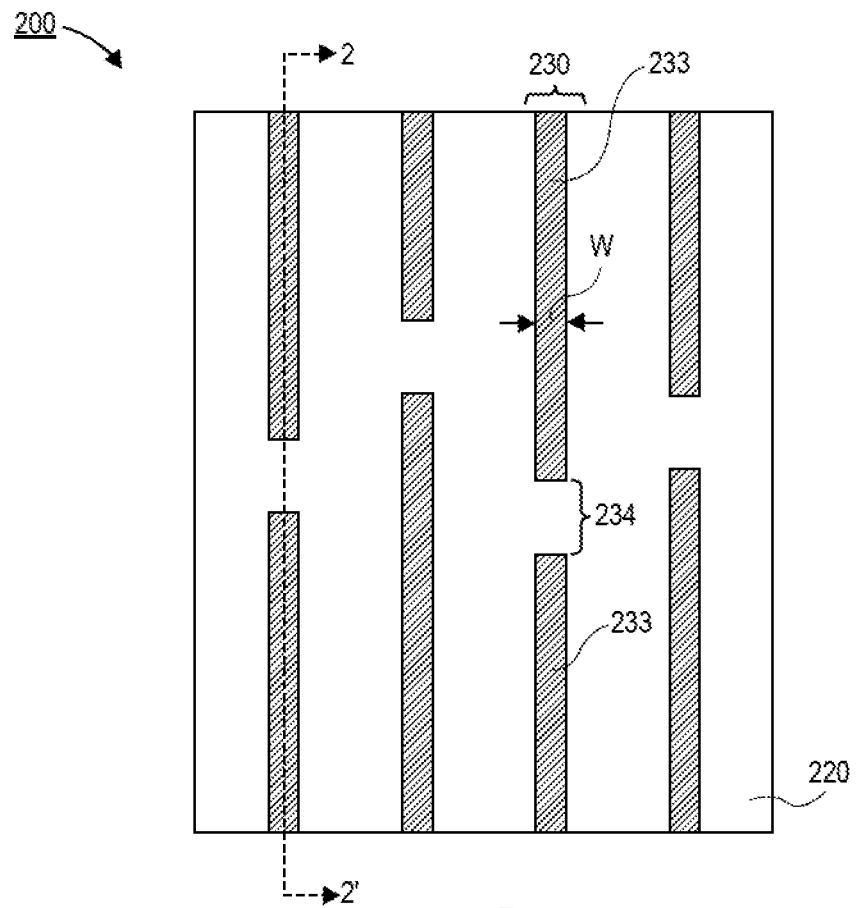
FIG. 2A is a plan view illustration of an interconnect layer that shows a plurality of tracks across the interconnect layer, in accordance with an embodiment.

Referring now to FIG. 2A, a plan view illustration of an interconnect layer 200 is shown, in accordance with an embodiment. In an embodiment, the interconnect layer 200 comprises a plurality of tracks 230. Each track 230 may comprise one or more segments 233. The individual segments 233 may be electrically separated from each other. For example, the segments 233 may be separated by portions of ILD material that are sometimes referred to as plugs 234. From the plan view shown in FIG. 2A, it is not possible to determine if the segments are first interconnects or second interconnects. This is because the width W is uniform for both types of interconnects.

Figure 2B:
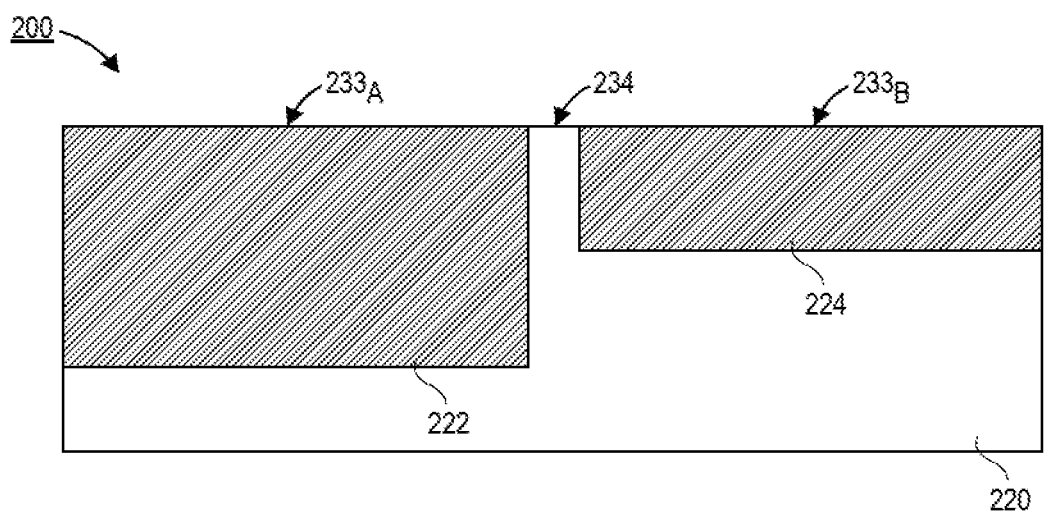
FIG. 2B is a cross-sectional illustration along one of the tracks in FIG. 2A, in accordance with an embodiment.

Referring now to FIG. 2B, a cross-sectional illustration of the interconnect layer 200 along line 2-2' in FIG. 2A is shown, in accordance with an embodiment. As shown, the first segment 233A is a first interconnect 222, and the second segment 233B is a second interconnect 224. Accordingly, a single track 230 may comprise interconnects with different heights. However, it is to be appreciated that a track 230 may also comprise a single type of interconnect.

Figure 2C:
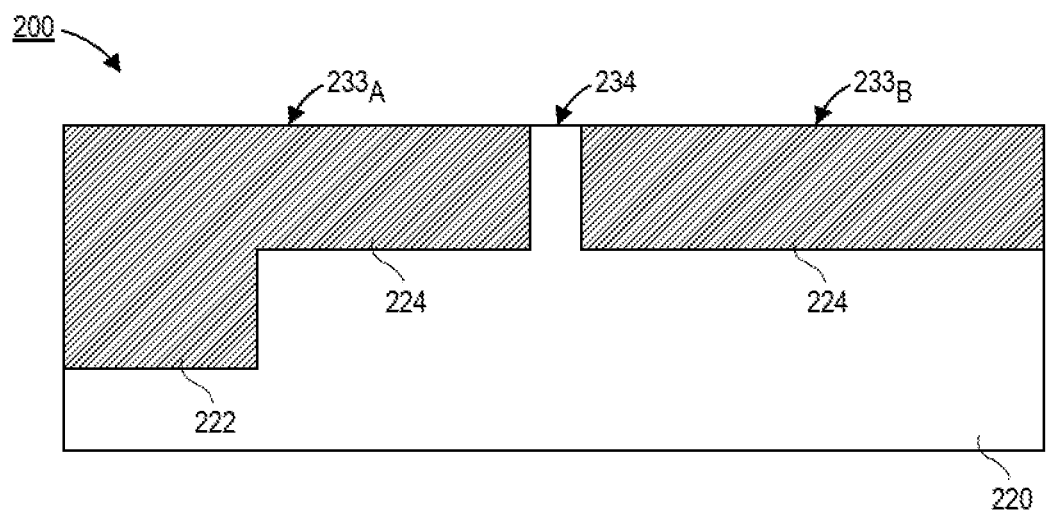
FIG. 2C is a cross-sectional illustration along one of the tracks in FIG. 2A, in accordance with an additional embodiment.

Referring now to FIG. 2C, a cross-sectional illustration of the interconnect layer 200 along line 2-2' in FIG. 2A is shown, in accordance with an additional embodiment. In FIG. 2C, the first segment 233A includes both a first interconnect 222 and a second interconnect 224. That is, a single segment 233 may have a non-uniform height.

Figure 3A:
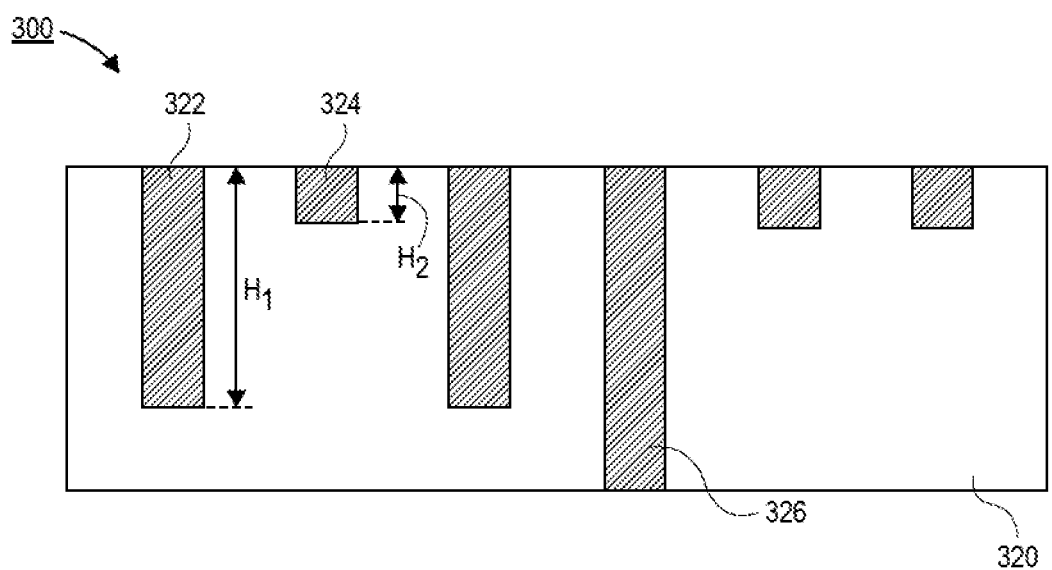
FIG. 3A is a cross-sectional illustration of an interconnect layer with first interconnects and second interconnects with a high ratio between the heights of the first interconnects and the heights of the second interconnects.

Referring now to FIG. 3A, a cross-sectional illustration of an interconnect layer 300 is shown, in accordance with an embodiment. The interconnect layer 300 comprises an ILD 320, first interconnects 322, second interconnects 324, and a via 326. In an embodiment, the interconnect layer 300 may be substantially similar to the interconnect layer 100 in FIG. 1B, with the exception the second interconnects 324 are shorter than the second interconnects 124. This illustrates that a ratio between the first height $H_1$ of the first interconnects 322 and the second height $H_2$ of the second interconnects 324 are not limited to any particular value. For example, the ratio of the first height $H_1$ to the second height $H_2$ (i.e., $H_1:H_2$) may be 10:1 or less, 5:1 or less, 2:1 or less, or 3:2 or less.

Figure 3B:
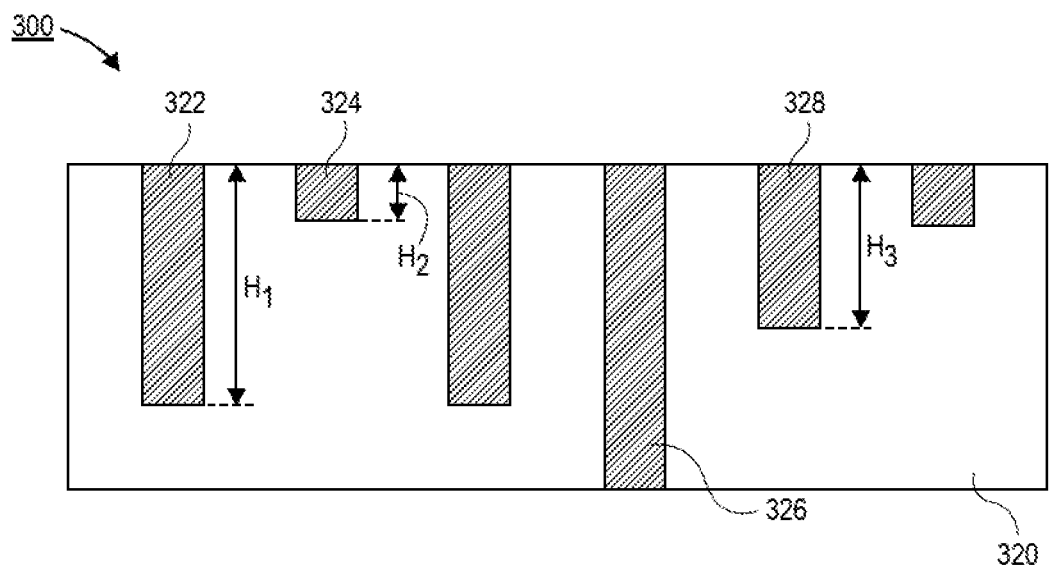
FIG. 3B is a cross-sectional illustration of an interconnect layer with first interconnects, second interconnects, and third interconnects, in accordance with an embodiment.

Referring now to FIG. 3B, a cross-sectional illustration of an interconnect layer 300 is shown, in accordance with an additional embodiment. In an embodiment, the interconnect layer 300 in FIG. 3B is substantially similar to the interconnect layer 300 in FIG. 3A, with the exception that a third interconnect 328 is included in the interconnect layer 300. In an embodiment, the third interconnect 328 may have a third height $H_3$. The third height $H_3$ may be less than the first height $H_1$ and greater than the second height $H_2$. The third interconnect 328 may be referred to as an intermediate interconnect. Accordingly, it is to be appreciated that interconnect layers 300 may comprise more than two interconnect heights. While three interconnect heights are shown in FIG. 3B, it is to be appreciated that any number of interconnect heights may be obtained. However, as will be described in greater detail below, it is to be appreciated that increases to the number of interconnect heights will also result in increases to the processing costs.

Figure 4A:
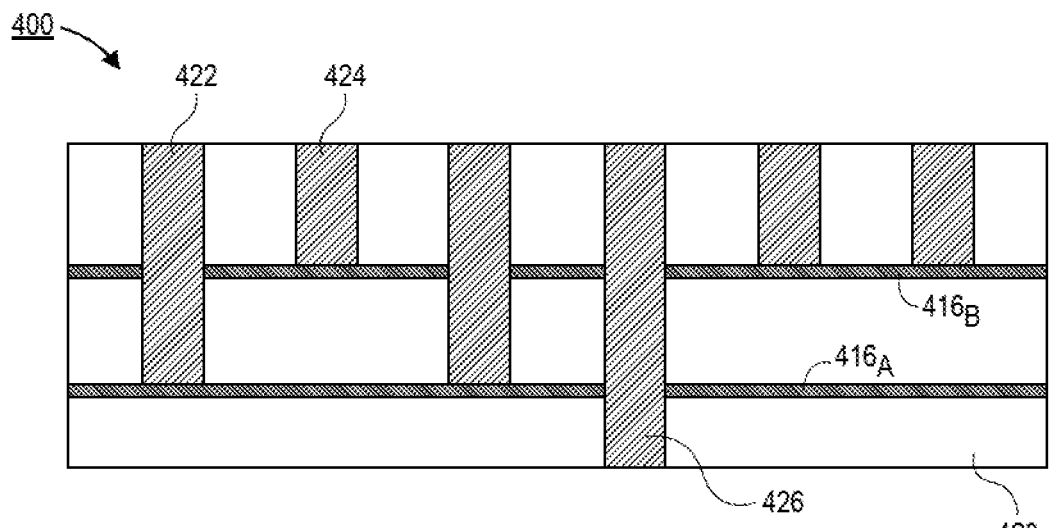
FIG. 4A is a cross-sectional illustration of an interconnect layer with a plurality of etchstop layers within an interlayer dielectric (ILD), in accordance with an embodiment.
Figure 4B:
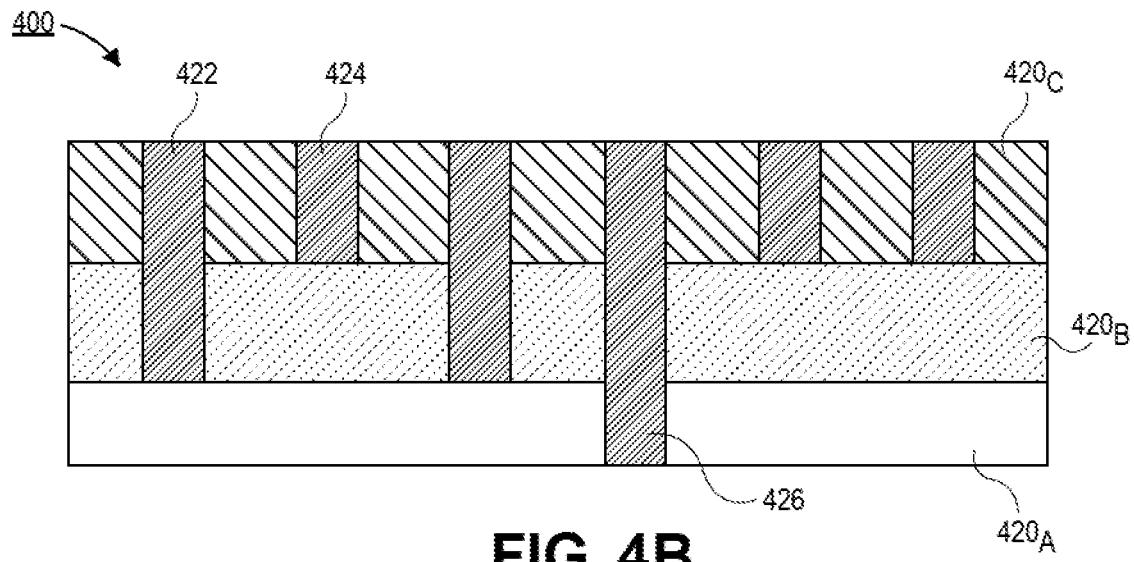
FIG. 4B is a cross-sectional illustration of an interconnect layer with a plurality of different ILDs, in accordance with an embodiment.

Referring now to FIGS. 4A and 4B, cross-sectional illustrations of interconnect layers 400 are shown, in accordance with various embodiments. The interconnect layers 400 are similar to the interconnect layer 100 in FIG. 1B, with the exception that the interconnect layers 400 include features to more accurately define the heights of the first interconnects 422 and the second interconnects 424.

Referring now to FIG. 4A, a cross-sectional illustration of an interconnect layer 400 is shown, in accordance with an embodiment. In an embodiment, the interconnect layer 400 includes an ILD 420. One or more etchstop layers 416 may be disposed in the ILD 420. For example, a first etchstop layer $416_A$ may define the bottom surfaces of the first interconnects 422, and a second etchstop layer $416_B$ may define the bottom surfaces of the second interconnects 424. In an embodiment, the etchstop layers 416 may be any suitable material that is etch selective to the ILD 420. In an embodiment, the first interconnects 422 may pass through the second etchstop layer $416_B$, and the via 426 may pass through the first etchstop layer $416_A$.

Referring now to FIG. 4B, a cross-sectional illustration of an interconnect layer 400 is shown, in accordance with an additional embodiment. In an embodiment, the interconnect layer 400 may comprise a multi-layered ILD. For example the interconnect layer 400 may comprise a first ILD $420_A$, a second ILD $420_B$, and a third ILD $420_C$. In an embodiment, the different ILDs 420 may be etch selective to each other. Accordingly, the first interconnects 422 may be stopped at the interface between the first ILD $420_A$ and the second ILD $420_B$, and the second interconnects 424 may be stopped at the interface between the second ILD $420_B$ and the third ILD $420_C$.

Figure 5:
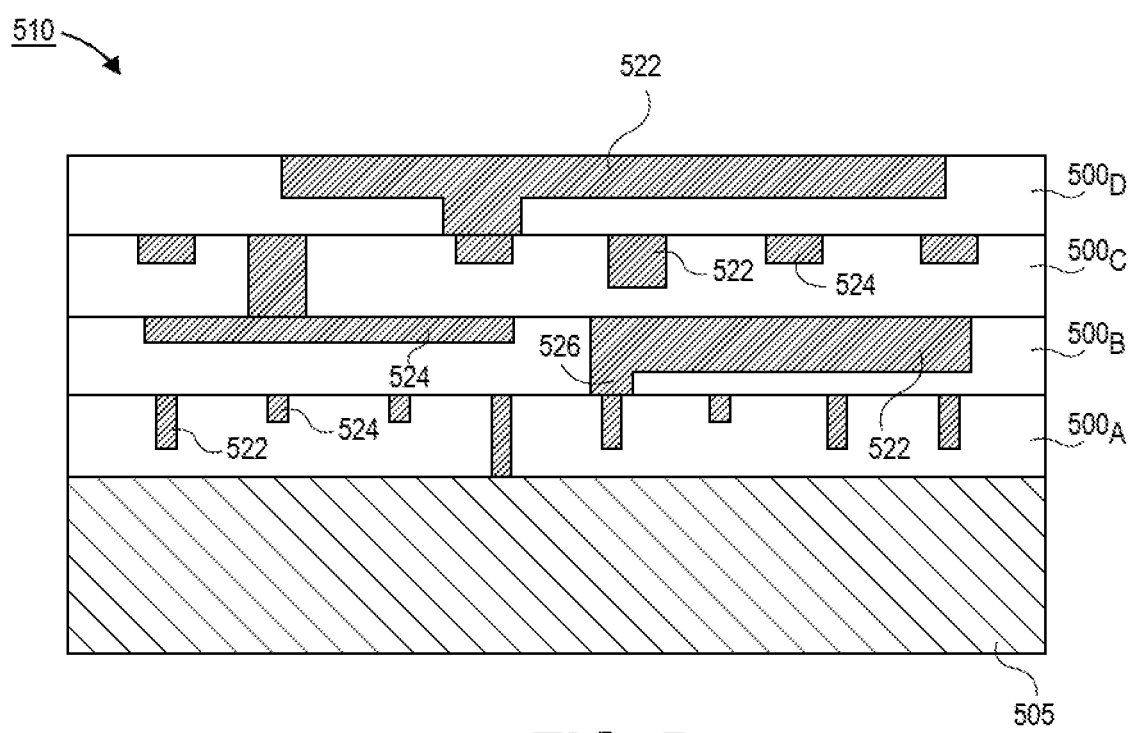
FIG. 5 is a cross-sectional illustration of a semiconductor die that comprises a plurality of interconnect layers with non-uniform interconnect heights in one or more layers, in accordance with an embodiment.

Referring now to FIG. 5, a cross-sectional illustration of a semiconductor die 510 is shown, in accordance with an embodiment. In an embodiment, the semiconductor die 510 may comprise a semiconductor substrate 505 and a plurality of interconnect layers 500 over the semiconductor substrate 505. The semiconductor substrate 505 may comprise a plurality of transistors or the like that are electrically coupled to interconnects 522/524 and vias 526 of the various interconnect layers 500.

In an embodiment, the underlying semiconductor substrate 505 represents a general workpiece object used to manufacture integrated circuits. The semiconductor substrate 505 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate 505, depending on the stage of manufacture, often includes transistors, integrated circuitry, and the like. The semiconductor substrate 505 may also include semiconductor materials, metals, dielectrics, dopants, and other materials commonly found in semiconductor substrates.

In the illustrated embodiment, four interconnect layers $500_{A-D}$ are shown. However, it is to be appreciated that there may be any number of interconnect layers 500 depending on the complexity of the semiconductor die 510. In an embodiment, one or more of the interconnect layers 500 may include interconnects with a non-uniform height. For example, interconnect layers $500_A$, $500_B$, and $500_C$ include first interconnects 522 and second interconnects 524. Furthermore, it is to be appreciated that not all interconnect layers 500 necessarily include non-uniform interconnect heights. For example, the fourth interconnect layer $500_D$ only includes first interconnects 522. In the illustrated embodiment, the uniform height interconnect layer $500_D$ is shown as the topmost layer. However, it is to be appreciated that a uniform height interconnect layer $500_D$ may also be positioned between interconnect layers 500 with non-uniform interconnect heights or below interconnect layers 500 with non-uniform interconnect heights.

Figure 6A:
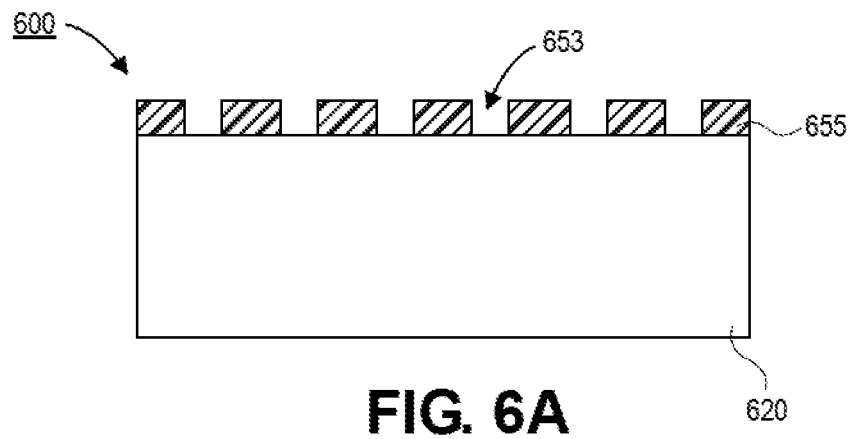
FIG. 6A is a cross-sectional illustration of an interconnect layer with a grating over the interconnect layer, in accordance with an embodiment.
Figure 6B:
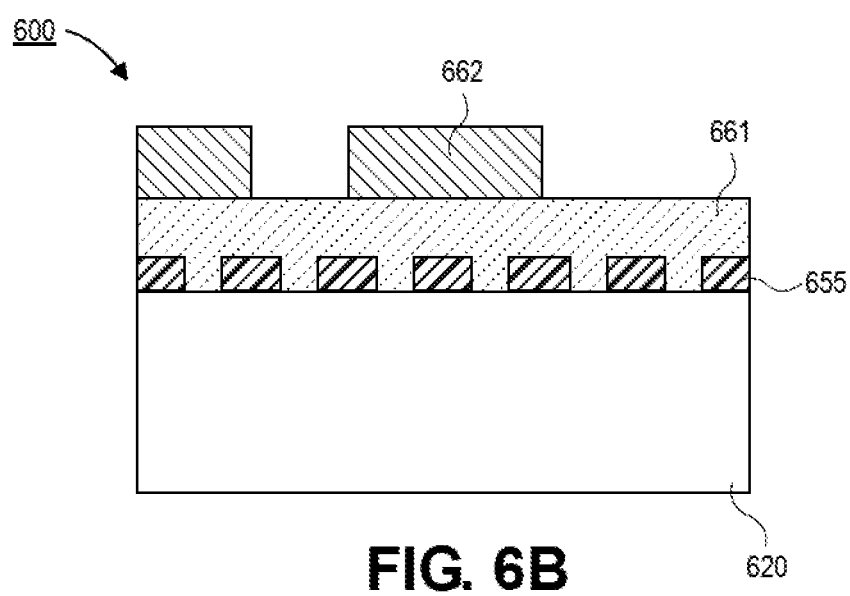
FIG. 6B is a cross-sectional illustration of the interconnect layer after a mask layer and a resist layer are disposed over the grating, in accordance with an embodiment.
Figure 6C:
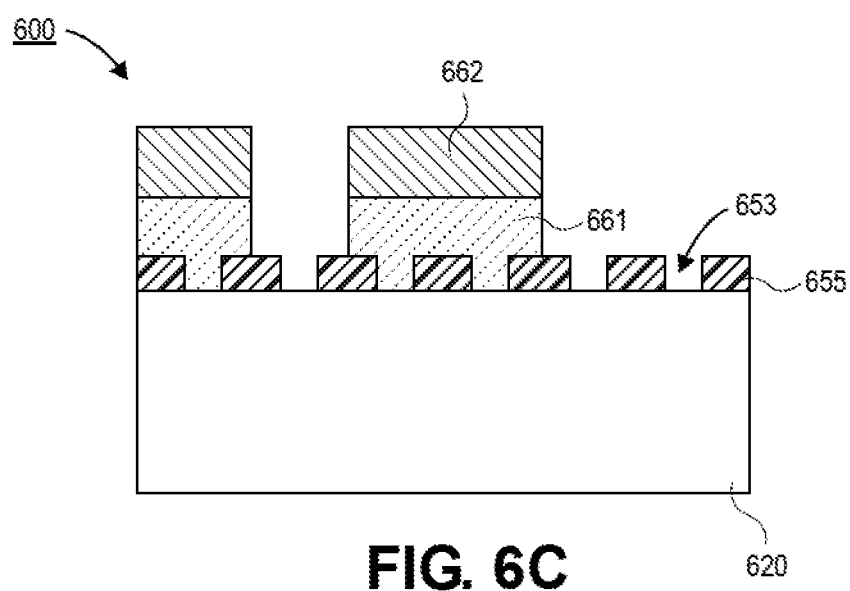
FIG. 6C is a cross-sectional illustration of the interconnect layer after the mask layer is patterned, in accordance with an embodiment.
Figure 6D:
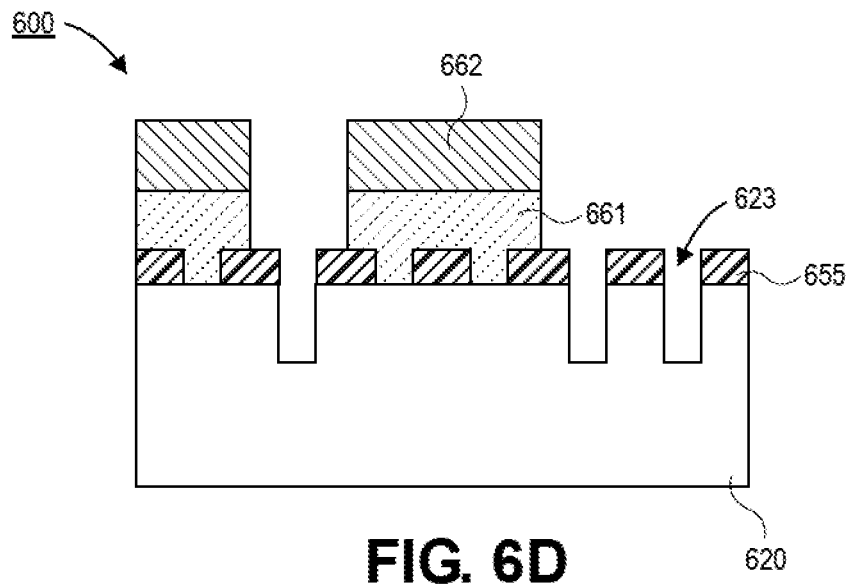
FIG. 6D is a cross-sectional illustration of the interconnect layer after first trenches are formed into the ILD, in accordance with an embodiment.
Figure 6E:
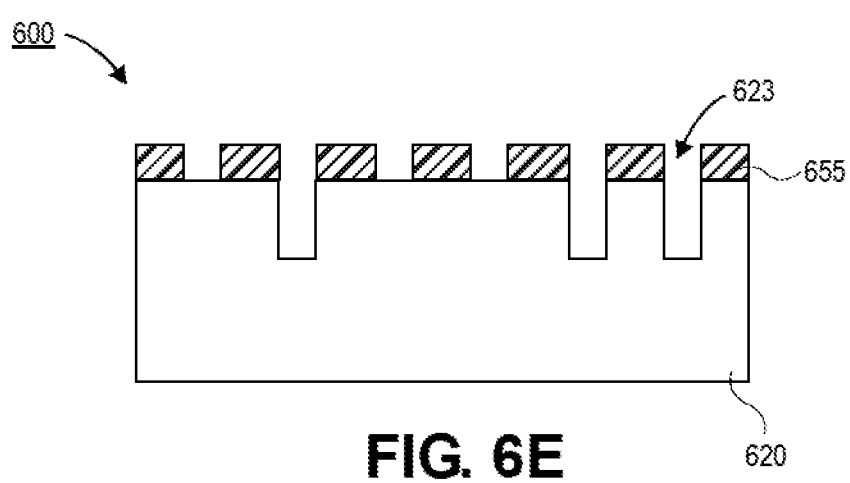
FIG. 6E is a cross-sectional illustration of the interconnect layer after the mask layer is removed, in accordance with an embodiment.
Figure 6F:
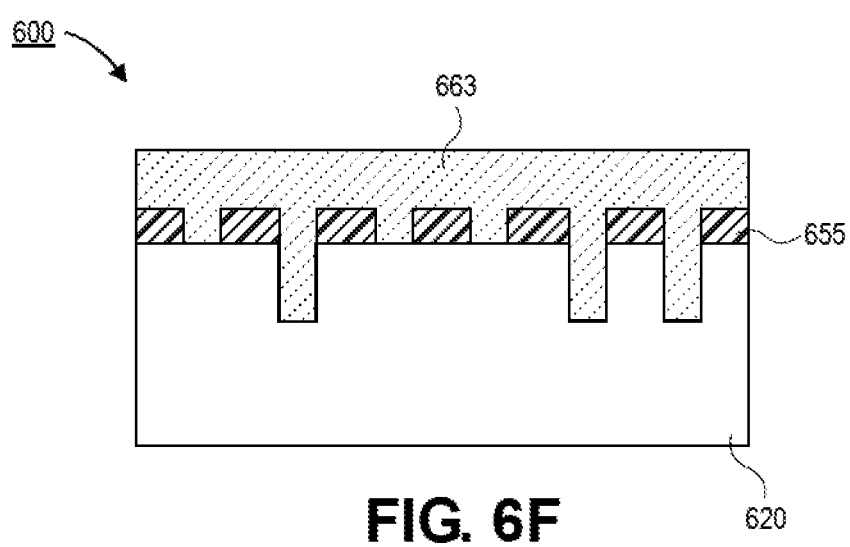
FIG. 6F is a cross-sectional illustration of the interconnect layer after a mask layer is disposed over the surface, in accordance with an embodiment.
Figure 6G:
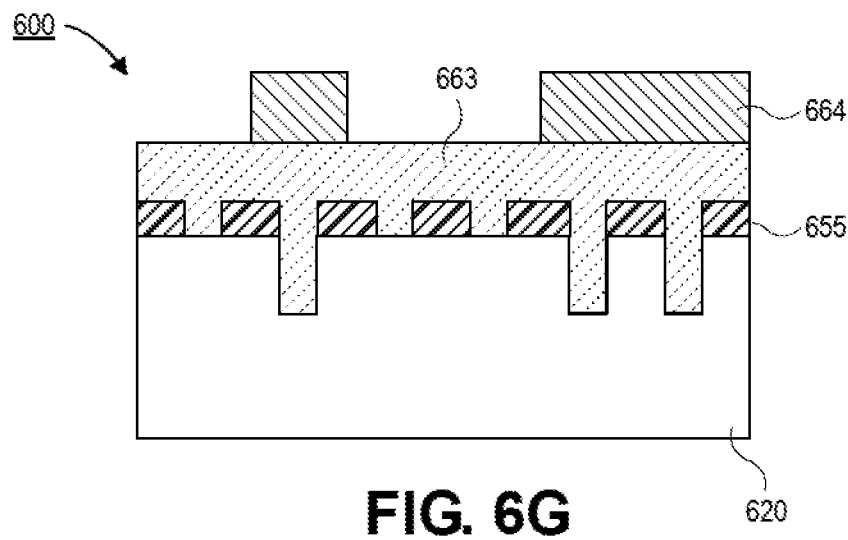
FIG. 6G is a cross-sectional illustration of the interconnect layer after a resist layer is disposed over the mask layer, in accordance with an embodiment.
Figure 6H:
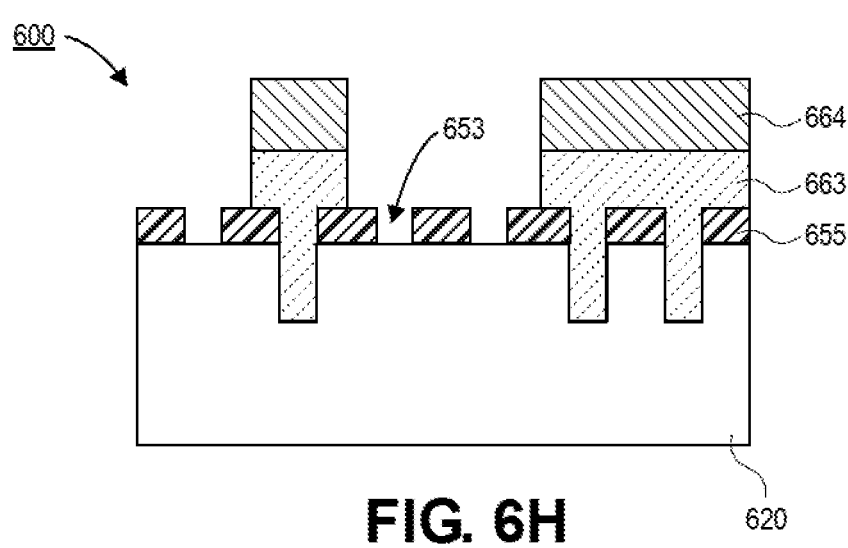
FIG. 6H is a cross-sectional illustration of the interconnect layer after the mask layer is patterned, in accordance with an embodiment.
Figure 6I:
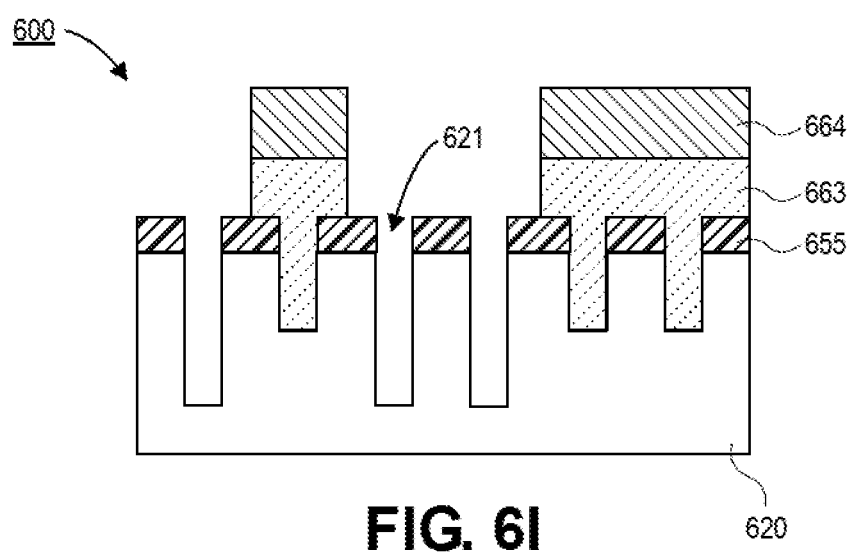
FIG. 6I is a cross-sectional illustration of the interconnect layer after second trenches are formed into the ILD, in accordance with an embodiment.
Figure 6J:
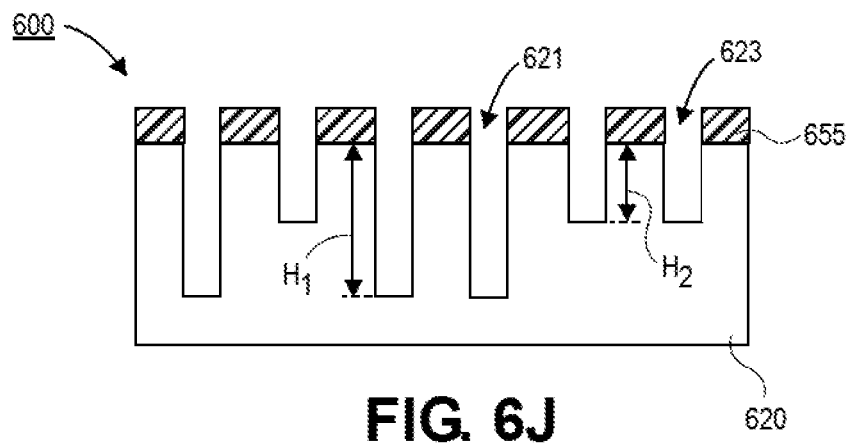
FIG. 6J is a cross-sectional illustration of the interconnect layer after the mask layer is removed, in accordance with an embodiment.
Figure 6K:
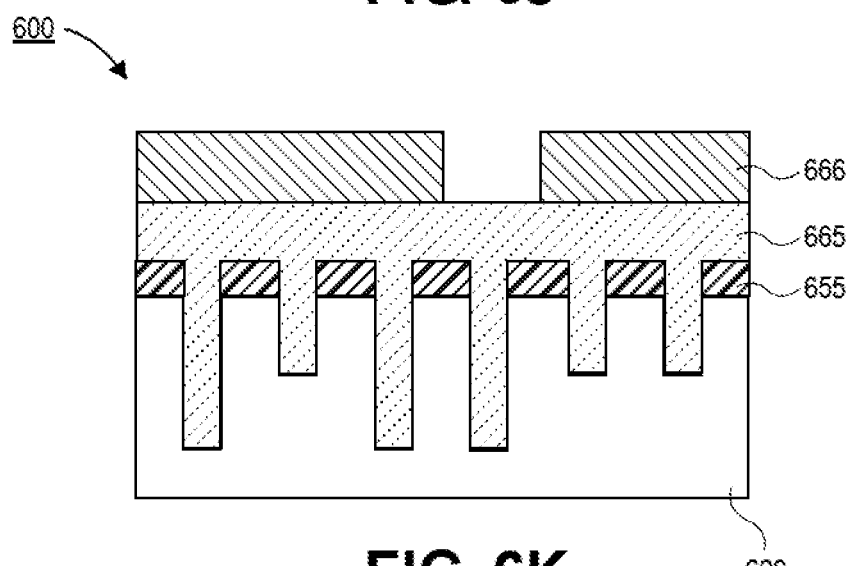
FIG. 6K is a cross-sectional illustration of the interconnect layer after a mask layer and a resist layer are disposed over the surface, in accordance with an embodiment.
Figure 6L:
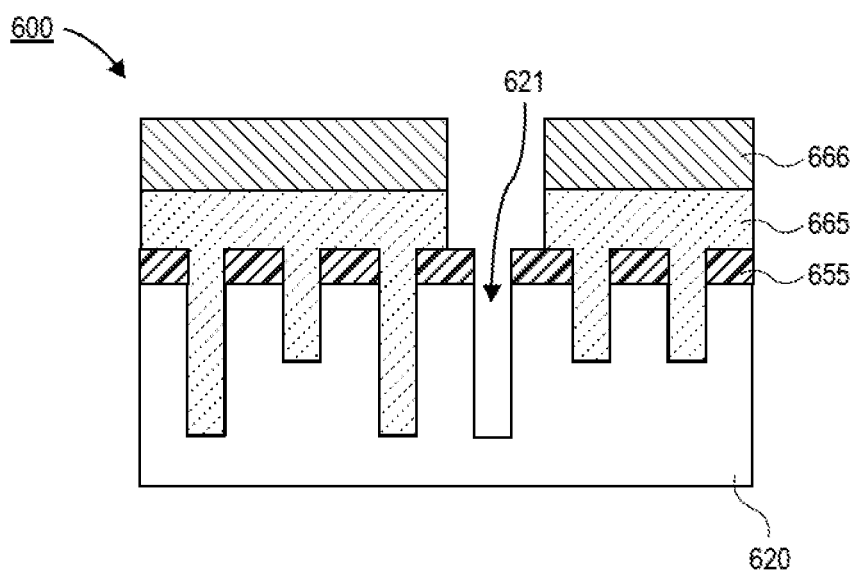
FIG. 6L is a cross-sectional illustration of the interconnect layer after the mask layer is patterned, in accordance with an embodiment.
Figure 6M:
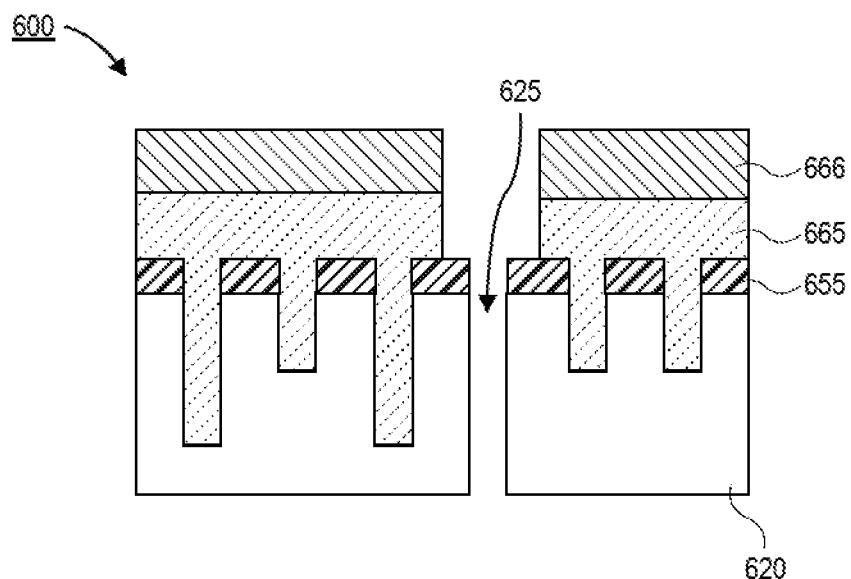
FIG. 6M is a cross-sectional illustration of the interconnect layer after a via opening is formed into the ILD, in accordance with an embodiment.
Figure 6N:
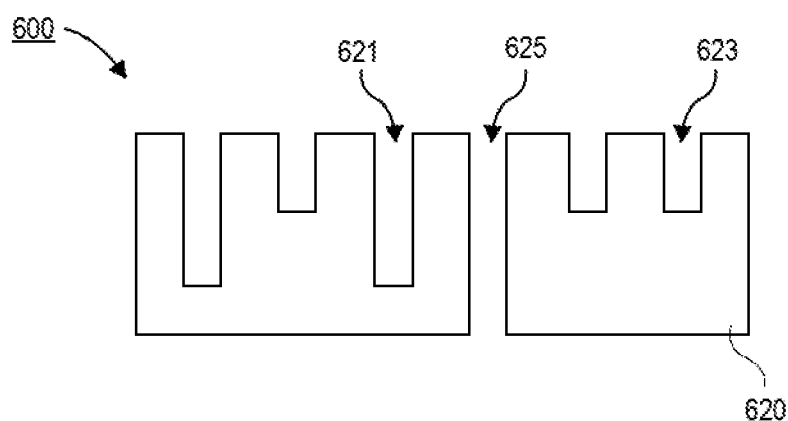
FIG. 6N is a cross-sectional illustration of the interconnect layer after the mask layer is removed, in accordance with an embodiment.
Figure 6O:
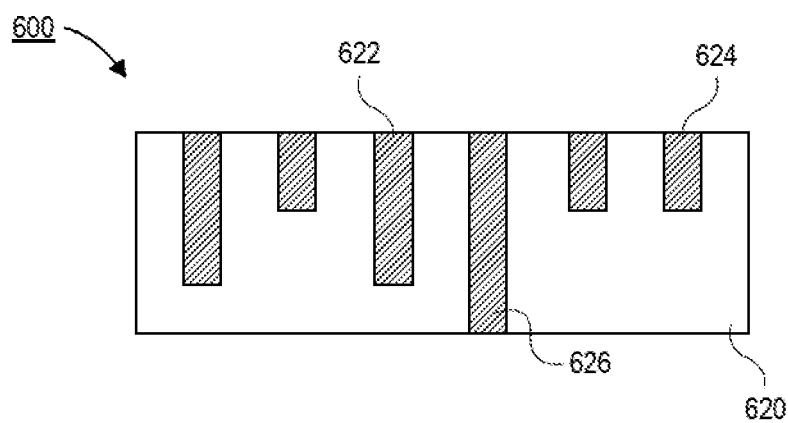
FIG. 6O is a cross-sectional illustration of the interconnect layer after interconnects are disposed into the trenches, in accordance with an embodiment.

Referring now to FIGS. 6A-6O, a series of cross-sectional illustrations of a process for forming an interconnect layer 600 is shown, in accordance with an embodiment.

Referring now to FIG. 6A, a cross-sectional illustration of an interconnect layer 600 is shown, in accordance with an embodiment. In an embodiment, the interconnect layer 600 may comprise an ILD 620. In the illustrated embodiment, the ILD 620 is shown as a single layer. However, it is to be appreciated that in some embodiments the ILD 620 may comprise one or more etchstop layers (e.g., similar to FIG. 4A), or the ILD 620 may comprise a plurality of etch selective ILD layers 620 (e.g., similar to FIG. 4B).

In an embodiment, a grating 655 may be disposed over the ILD 620. The grating 655 may comprise a plurality of openings 653. The grating 655 may be a hardmask material that has an etch selectivity to the ILD 620. That is, the grating 655 may be used as a mask to pattern the ILD 620. In an embodiment, the grating 655 may be a 1-D grating or a 2-D grating (e.g., a cross-grating). The grating 655 may be formed with any suitable processes known in the art for forming gratings 655.

Referring now to FIG. 6B, a cross-sectional illustration of the interconnect layer 600 after a mask layer 661 and a resist layer 662 are disposed over the grating 655 and the ILD 620 is shown, in accordance with an embodiment. In an embodiment, the resist layer 662 may be a photoresist or the like. While shown as a single layer, it is to be appreciated that the resist layer 662 may comprise any number of layers. In an embodiment, the resist layer 662 is patterned (e.g., with a lithographic process).

Referring now to FIG. 6C, a cross-sectional illustration of the interconnect layer 600 after the mask layer 661 is patterned is shown, in accordance with an embodiment. In an embodiment, the mask layer 661 may be patterned with an etching process. The patterned mask layer 661 exposes selected ones of the openings 653 through the grating 655.

Referring now to FIG. 6D, a cross-sectional illustration of the interconnect layer 600 after first trenches 623 are formed into the ILD 620 is shown, in accordance with an embodiment. In an embodiment, the first trenches 623 may be formed with an etching process. For example, a timed etch may be used. In embodiments with etchstop features, the etchstop layers or ILD interfaces may define the depth of the first trenches 623 in order to provide improved uniformity.

Referring now to FIG. 6E, a cross-sectional illustration of the interconnect layer 600 after the mask layer 661 and the resist layer 662 are removed is shown. In an embodiment, the mask layer 661 and the resist layer 662 may be removed with any suitable process, such as ashing or the like.

Referring now to FIG. 6F, a cross-sectional illustration of the interconnect layer 600 after a second mask 663 is disposed over the grating 655 and the ILD 620 is shown, in accordance with an embodiment. In an embodiment, the second mask layer 663 may fill the first trenches 623.

Referring now to FIG. 6G, a cross-sectional illustration of the interconnect layer 600 after a second resist layer 664 is disposed over the second mask layer 663 is shown, in accordance with an embodiment. In an embodiment, the second resist layer 664 may be patterned. For example, the second resist layer 664 may be exposed and developed using typical lithographic processing.

Referring now to FIG. 6H, a cross-sectional illustration of the interconnect layer 600 after the second mask layer 663 is patterned is shown, in accordance with an embodiment. In an embodiment, the second mask layer 663 may be patterned with an etching process. The patterning of the second mask layer 663 exposes selected ones of the openings 653 in the grating 655. Particularly, the exposed openings 653 are the openings above the portions of the ILD 620 that have not been etched. That is, the first trenches 623 remain covered.

Referring now to FIG. 6I, a cross-sectional illustration of the interconnect layer 600 after the second trenches 621 are formed into the ILD 620 is shown, in accordance with an embodiment. In an embodiment, the second trenches 621 may be formed with an etching process. For example, a timed etch may be used. In embodiments with etchstop features, the etchstop layers or ILD interfaces may define the depth of the second trenches 621 in order to provide improved uniformity.

Referring now to FIG. 6J, a cross-sectional illustration of the interconnect layer 600 after the second mask layer 663 and the second resist layer 664 are removed is shown, in accordance with an embodiment. In an embodiment, the second mask layer 663 and the second resist layer 664 may be removed with an ashing process or the like. As shown, the interconnect layer 600 now includes first trenches 623 and second trenches 621. In an embodiment, the second trenches 621 may have a first height $H_1$ that is greater than a second height $H_2$ of the first trenches 623. That is, the interconnect layer 600 may comprise trenches with a non-uniform height.

In FIGS. 6A-6J masking and patterning operations provide two different trench heights (i.e., first trenches 623 and second trenches 621). However, embodiments may also include implementing additional iterations of masking and etching in order to provide three or more different trench heights.

Referring now to FIG. 6K, a cross-sectional illustration of the interconnect layer 600 after a third mask layer 665 and a third resist 666 are disposed over the grating 655 and the ILD 620 is shown, in accordance with an embodiment. In an embodiment, the third mask layer 665 may fill all of the first trenches 623 and the second trenches 621. The third resist layer 666 may be patterned.

Referring now to FIG. 6L, a cross-sectional illustration of the interconnect layer 600 after the pattern of the third resist 666 is transferred into the third mask layer 665 is shown, in accordance with an embodiment. In an embodiment, the opening through the third mask layer 665 exposes one or more of the trenches. In the illustrated embodiment, a second trench 621 is exposed. However, in other embodiments a first trench 623 may be exposed, or both a first trench 623 and a second trench 621 may be exposed.

Referring now to FIG. 6M, a cross-sectional illustration of the interconnect layer 600 after a via opening 625 is formed through the ILD 620 at the bottom of one of the trenches is shown, in accordance with an embodiment. In an embodiment, the via opening 625 passes down through the bottom of the ILD 620. The via opening 625 may expose a pad, interconnect, electrode, or the like (not shown) that underlies the interconnect layer 600.

Referring now to FIG. 6N, a cross-sectional illustration of the interconnect layer 600 after the third mask layer 665 and the third resist layer 666 are removed is shown, in accordance with an embodiment. In an embodiment, the third mask layer 665 and the third resist layer 666 may be removed with an ashing process or the like.

Referring now to FIG. 6O, a cross-sectional illustration of the interconnect layer 600 after conductive features are disposed into the trenches and via opening is shown, in accordance with an embodiment. Accordingly, first interconnects 624 may be disposed in the first trenches 623, second interconnects 622 may be disposed in the second trenches 621, and a via 626 may be disposed in the via opening 625. In an embodiment, the conductive features comprise copper, and may include a barrier layer. Any suitable deposition process, such as electroplating, chemical vapor deposition or physical vapor deposition, may be used to form interconnects 622/624.

Referring now to FIGS. 7A-7I, a series of cross-sectional illustrations depicting an additional process to form an interconnect layer 700 is shown, in accordance with an embodiment.

Figure 7A:
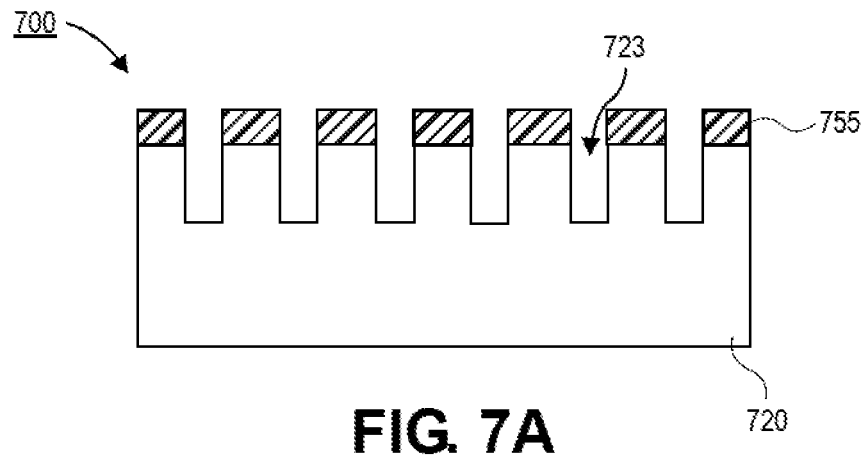
FIG. 7A is a cross-sectional illustration of an interconnect layer after first trenches are formed into an ILD, in accordance with an embodiment.

Referring now to FIG. 7A, a cross-sectional illustration of an interconnect layer 700 after first trenches 723 are formed into an ILD 720 is shown, in accordance with an embodiment. In an embodiment, the first trenches 723 may be patterned using a hardmask grating 755 or the like. In an embodiment, the etching process may be a timed etching process. Other embodiments include the use of an etchstop feature (such as those described above in FIGS. 4A and 4B) to provide more uniform control of the trench depth.

Figure 7B:
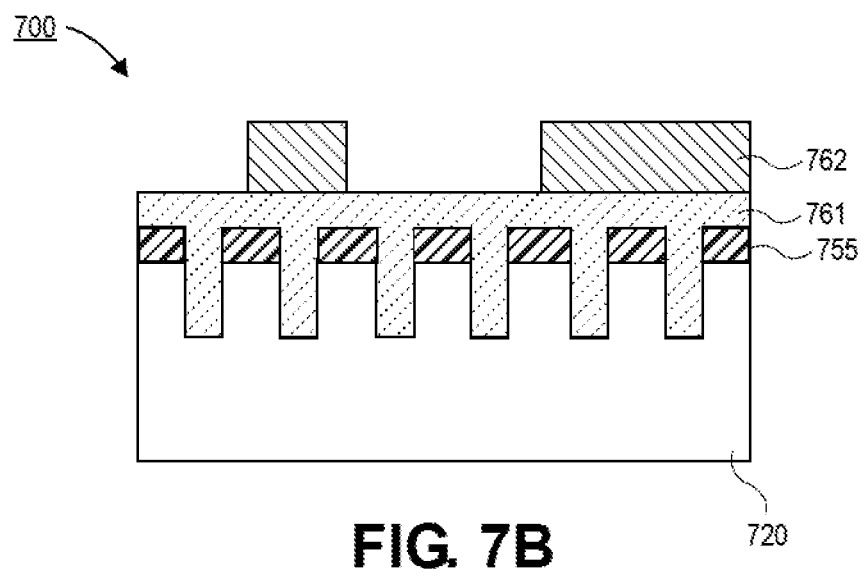
FIG. 7B is a cross-sectional illustration of the interconnect layer after a mask layer is disposed over the ILD, in accordance with an embodiment.

Referring now to FIG. 7B, a cross-sectional illustration of the interconnect layer 700 after a mask layer 761 and a resist layer 762 is disposed over the ILD 720 is shown, in accordance with an embodiment. In an embodiment, the mask layer 761 fills the first trenches 723. The resist layer 762 may be patterned using typical lithographic exposure and developing processes.

Figure 7C:
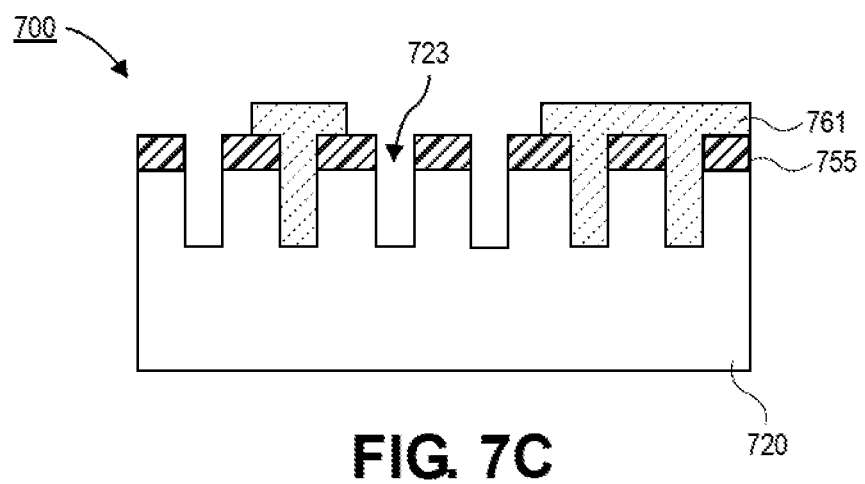
FIG. 7C is a cross-sectional illustration of the interconnect layer after the mask layer is patterned, in accordance with an embodiment.

Referring now to FIG. 7C, a cross-sectional illustration of the interconnect layer 700 after the mask layer 761 is patterned is shown, in accordance with an embodiment. In an embodiment, the mask layer 761 may be patterned with an etching process using the resist layer 762 as an etching mask. The patterning of the mask layer 761 clears selected ones of the first trenches 723. After the mask layer 761 is patterned, the resist layer 762 may be removed.

Figure 7D:
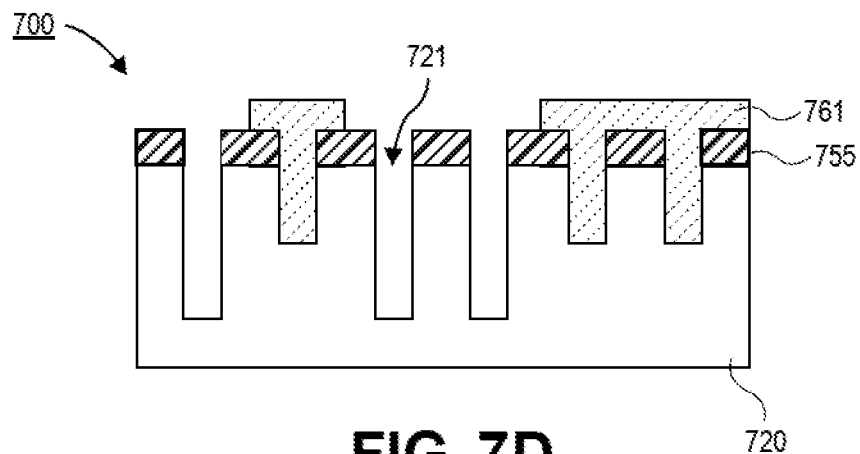
FIG. 7D is a cross-sectional illustration of the interconnect layer after second trenches are formed into the ILD, in accordance with an embodiment.

Referring now to FIG. 7D, a cross-sectional illustration of the interconnect layer 700 after the second trenches 721 are formed into the ILD 720 is shown, in accordance with an embodiment. The second trenches 721 may be formed with an etching process that etches through the bottom of the exposed first trenches 723. The etching process may be a timed etching process, or the etching process may be assisted by the use of etchstop features, such as those described above.

Figure 7E:
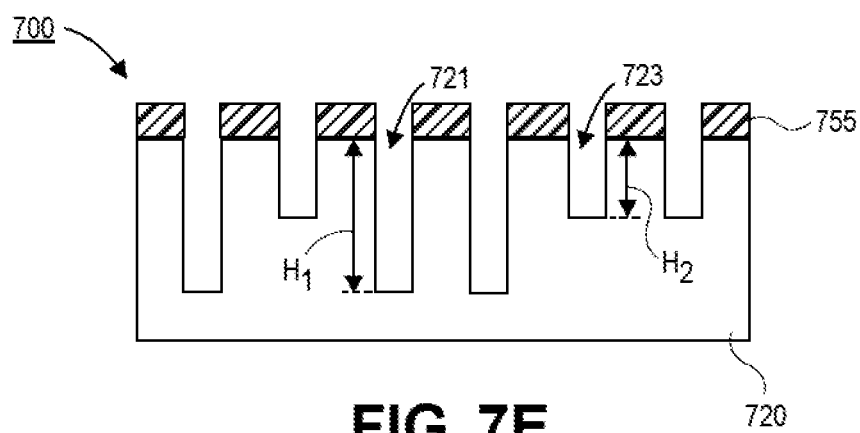
FIG. 7E is a cross-sectional illustration of the interconnect layer after the mask layer is removed, in accordance with an embodiment.

Referring now to FIG. 7E, a cross-sectional illustration of the interconnect layer 700 after the mask layer 761 is removed is shown, in accordance with an embodiment. In an embodiment, the mask layer 761 may be removed with an ashing process or the like. As shown, the interconnect layer 700 now includes first trenches 723 and second trenches 721. In an embodiment, the second trenches 721 may have a first height $H_1$ that is greater than a second height $H_2$ of the first trenches 723. That is, the interconnect layer 700 may comprise trenches with a non-uniform height.

In FIGS. 7A-7E masking and patterning operations provide two different trench heights (i.e., first trenches 723 and second trenches 721). However, embodiments may also include implementing additional iterations of masking and etching in order to provide three or more different trench heights.

Figure 7F:
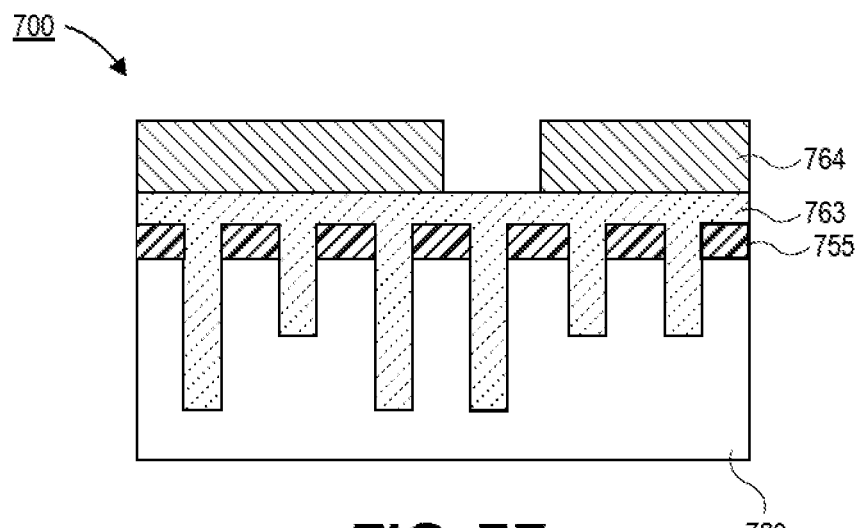
FIG. 7F is a cross-sectional illustration of the interconnect layer after a mask layer and a resist layer are disposed over ILD, in accordance with an embodiment.

Referring now to FIG. 7F, a cross-sectional illustration of the interconnect layer 700 after a second mask layer 763 and a second resist 764 are disposed over the ILD 720 is shown, in accordance with an embodiment. In an embodiment, the second mask layer 763 may fill all of the first trenches 723 and the second trenches 721. The second resist layer 764 may be patterned.

Figure 7G:
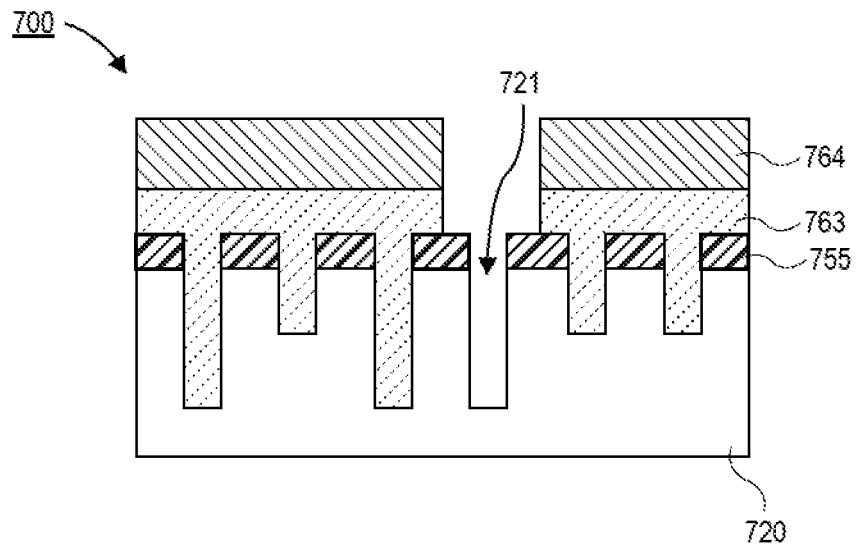
FIG. 7G is a cross-sectional illustration of the interconnect layer after the mask layer is patterned, in accordance with an embodiment.

Referring now to FIG. 7G, a cross-sectional illustration of the interconnect layer 700 after the pattern of the second resist 764 is transferred into the second mask layer 763 is shown, in accordance with an embodiment. In an embodiment, the opening through the second mask layer 763 exposes one or more of the trenches. In the illustrated embodiment, a second trench 721 is exposed. However, in other embodiments a first trench 723 may be exposed, or both a first trench 723 and a second trench 721 may be exposed.

Figure 7H:
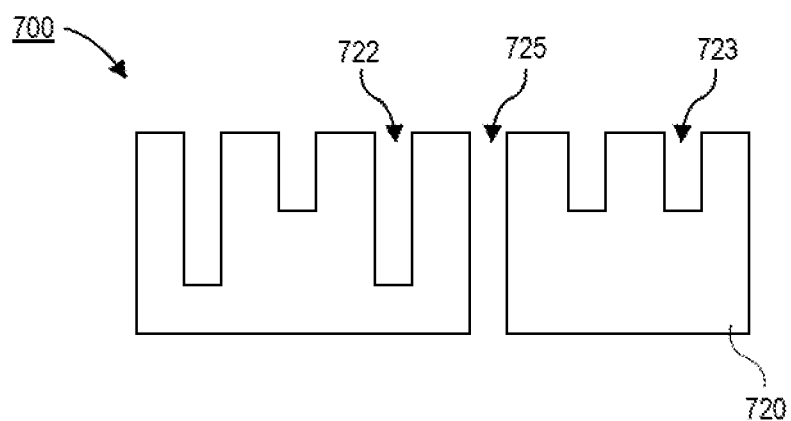
FIG. 7H is a cross-sectional illustration of the interconnect layer after a via opening is formed into the ILD, in accordance with an embodiment.

Referring now to FIG. 7H, a cross-sectional illustration of the interconnect layer 700 after a via opening 725 is formed through the ILD 720 at the bottom of one of the trenches is shown, in accordance with an embodiment. In an embodiment, the via opening 725 passes down through the bottom of the ILD 720. The via opening 725 may expose a pad, interconnect, electrode, or the like (not shown) that underlies the interconnect layer 700. In an embodiment, the second mask layer 763, the second resist layer 764, and the hardmask grating 755 may be removed after the formation of the via opening 725. In an embodiment, the second mask layer 763, the second resist layer 764, and the hardmask grating 755 may be removed with an ashing process or the like.

Figure 7I:
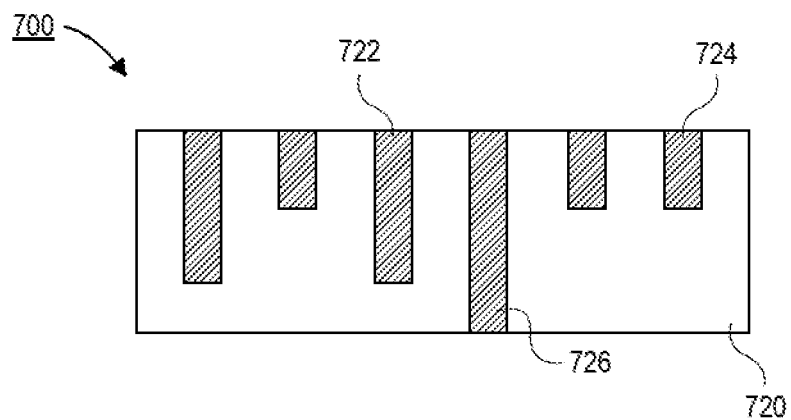
FIG. 7I is a cross-sectional illustration of the interconnect layer after interconnects are disposed into the trenches, in accordance with an embodiment.

Referring now to FIG. 7I, a cross-sectional illustration of the interconnect layer 700 after conductive features are disposed into the trenches and via opening is shown, in accordance with an embodiment. Accordingly, first interconnects 724 may be disposed in the first trenches 723, second interconnects 722 may be disposed in the second trenches 721, and a via 726 may be disposed in the via opening 725. In an embodiment, the conductive features comprise copper, and may include a barrier layer. Any suitable deposition process, such as electroplating, chemical vapor deposition or physical vapor deposition, may be used to form interconnects 722/724.

While two process flows (FIGS. 6A-6O and FIGS. 7A-7I) are provided herein, it is to be appreciated that other processing flows may be used to form structures substantially similar to embodiments disclosed herein. That is, the processing methods are not limited to those explicitly disclosed herein.

Figure 8:
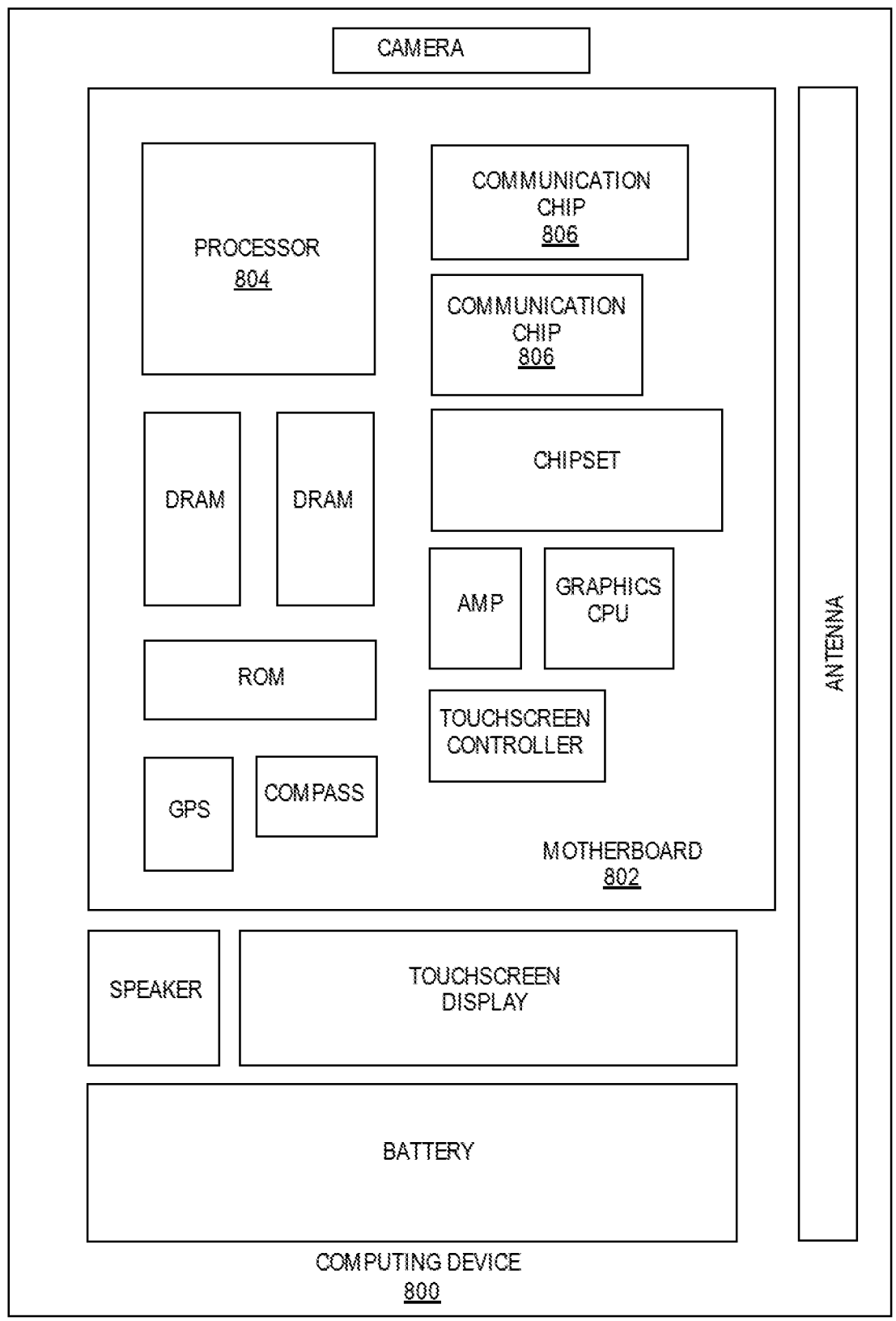
FIG. 8 illustrates a computing device in accordance with one implementation of an embodiment of the disclosure.

FIG. 8 illustrates a computing device 800 in accordance with one implementation of an embodiment of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In an embodiment, the integrated circuit die of the processor 804 may comprise interconnect layers that have interconnects with non-uniform heights, as described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In an embodiment, the integrated circuit die of the communication chip may comprise interconnect layers that have interconnects with non-uniform heights, as described herein.

In further implementations, another component housed within the computing device 800 may comprise interconnect layers that have interconnects with non-uniform heights, as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
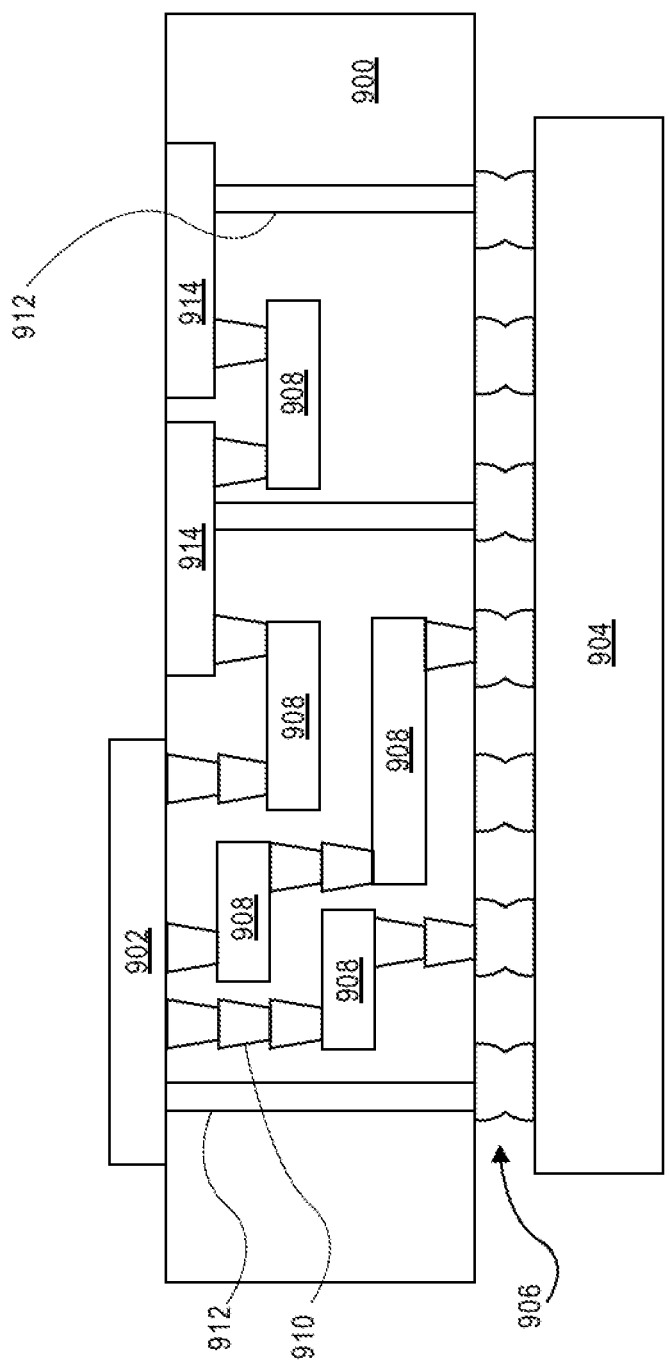
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. In an embodiment, one of both of the first substrate 902 and the second substrate 904 may comprise an overlay target with a first interference pattern, a second interference pattern, and a pattern recognition feature, or be fabricated using such an overlay target, in accordance with embodiments described herein. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900.

Thus, embodiments of the present disclosure may comprise interconnect layers that have interconnects with non-uniform heights, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: an interconnect layer, comprising: an interlayer dielectric (ILD); a first interconnect disposed in the ILD, wherein the first interconnect has a first height; and a second interconnect disposed in the ILD, wherein the second interconnect has a second height that is different than the first height.

Example 2: the interconnect layer of Example 1, wherein the first interconnect and the second interconnect are positioned along different tracks on the interconnect layer.

Example 3: the interconnect layer of Example 1, wherein the first interconnect and the second interconnect are positioned along a same track on the interconnect layer.

Example 4: the interconnect layer of Example 3, wherein the first interconnect is separated from the second interconnect by a dielectric material.

Example 5: the interconnect layer of Example 3, wherein the first interconnect directly contacts the second interconnect and comprise a single segment along the track.

Example 6: the interconnect layer of Examples 1-5, wherein a ratio of the first height to the second height is approximately 4:1 or smaller.

Example 7: the interconnect layer of Examples 1-6, wherein a width of the first interconnect is substantially equal to a width of the second interconnect.

Example 8: the interconnect layer of Examples 1-7, wherein a first surface of the first interconnect is substantially coplanar with a first surface of the second interconnect.

Example 9: the interconnect layer of Examples 1-8, further comprising: a first etchstop layer in the ILD, wherein the first etchstop layer is below the first interconnect; and a second etchstop layer in the ILD, wherein the second etchstop layer is below the second interconnect.

Example 10: the interconnect layer of Examples 1-9, wherein the ILD further comprises: a first ILD; a second ILD; and a third ILD, wherein the first ILD, the second ILD, and the third ILD are etch selective to each other.

Example 11: the interconnect layer of Examples 1-10, further comprising: a third interconnect disposed in the ILD, wherein the third interconnect has a third height that is between the first height and the second height.

Example 12: the interconnect layer of claim 1, further comprising: a via through the ILD.

Example 13: a semiconductor device, comprising: a semiconductor substrate; and a plurality of interconnect layers over the semiconductor substrate, wherein one or more of the interconnect layers comprise: an interlayer dielectric (ILD); a first interconnect disposed in the ILD, wherein the first interconnect has a first height; and a second interconnect disposed in the ILD, wherein the second interconnect has a second height that is different than the first height.

Example 14: the semiconductor device of Example 13, wherein a first interconnect layer and a second interconnect layer both comprise the first interconnect and the second interconnect.

Example 15: the semiconductor device of Example 14, wherein the first interconnect layer is directly below the second interconnect layer.

Example 16: the semiconductor device of Examples 13-15, wherein the first interconnect layer is spaced apart from the second interconnect layer by one or more intervening interconnect layers.

Example 17: the semiconductor device of Examples 13-16, wherein at least one of the plurality of interconnect layers comprises interconnects with a uniform height.

Example 18: an electronic system, comprising: a board; and an electronic package electrically coupled to the board, wherein the electronic package comprises a semiconductor die, and wherein the die comprises: an interconnect layer with first interconnects and second interconnects, wherein a height of the first interconnects is different than a height of the second interconnects.

Example 19: the electronic system of Example 18, wherein the interconnect layer further comprises third interconnects, wherein a height of the third interconnects is different than the height of the first interconnects and the height of the second interconnects.

Example 20: the electronic system of Example 18 or Example 19, wherein interconnect layer comprises an interlayer dielectric (ILD).

Example 21: the electronic system of Example 20, wherein the interconnect layer further comprises a first etchstop layer and a second etchstop layer within the ILD.

Example 22: a method of forming an interconnect layer, comprising: disposing a grating over an interlayer dielectric (ILD); forming first trenches into the ILD through the grating, wherein the first trenches have a first depth; and forming second trenches into the ILD, wherein the second trenches have a second depth that is different than the first depth.

Example 23: the method of Example 22, further comprising: covering one or more openings in the grating before forming the first trenches; and covering the first trenches before forming the second trenches.

Example 24: the method of Example 22, wherein the first trenches are formed at all locations exposed by the grating, and wherein the method further comprises covering one or more of the first trenches, wherein the second trenches are formed at locations of exposed first trenches.

Example 25: the method of Examples 22-24, further comprising: forming a via through a bottom of a first trench or through a bottom of a second trench.

What is claimed is:

1. An interconnect layer, comprising:
   an interlayer dielectric (ILD);
   a first interconnect disposed in the ILD along a first track, wherein the first interconnect has a first height;
   a second interconnect disposed in the ILD along a second track, wherein the second interconnect has a second height that is less than the first height;
   a third interconnect disposed in the ILD along a third track, wherein the third interconnect has a third height that is between the first height and the second height, wherein the second interconnect is laterally between the third interconnect and the first interconnect;
   a fourth interconnect disposed in the ILD along a fourth track, wherein the fourth interconnect has the first height, wherein the fourth interconnect is laterally between the second interconnect and the third interconnect;
   a fifth interconnect disposed in the ILD along a fifth track, wherein the fifth track has the second height, wherein the fifth interconnect is adjacent to a side of the third interconnect opposite the fourth interconnect, and wherein each of the first interconnect, the second interconnect, the third interconnect, the fourth interconnect, and the fifth interconnect has a bottommost surface above a bottommost surface of the ILD; and
   a via through the ILD, the via laterally between the third interconnect and the fourth interconnect.

2. The interconnect layer of claim 1, wherein the first interconnect is separated from the second interconnect by a dielectric material.

3. The interconnect layer of claim 1, wherein a ratio of the first height to the second height is approximately 4:1 or smaller.

4. The interconnect layer of claim 1, wherein a width of the first interconnect is substantially equal to a width of the second interconnect.

5. The interconnect layer of claim 1, wherein a first surface of the first interconnect is substantially coplanar with a first surface of the second interconnect.

6. The interconnect layer of claim 1, further comprising:
a first etchstop layer in the ILD, wherein the first etchstop layer is below the first interconnect; and
a second etchstop layer in the ILD, wherein the second etchstop layer is below the second interconnect.

7. The interconnect layer of claim 1, wherein the ILD further comprises:
a first ILD;
a second ILD; and
a third ILD, wherein the first ILD, the second ILD, and the third ILD are etch selective to each other.

8. A semiconductor device, comprising:
a semiconductor substrate; and
a plurality of interconnect layers over the semiconductor substrate, wherein one or more of the interconnect layers comprise:
an interlayer dielectric (ILD);
a first interconnect disposed in the ILD along a first track, wherein the first interconnect has a first height;
a second interconnect disposed in the ILD along a second track, wherein the second interconnect has a second height that is less than the first height;
a third interconnect disposed in the ILD along a third track, wherein the third interconnect has a third height that is between the first height and the second height, wherein the second interconnect is laterally between the third interconnect and the first interconnect;
a fourth interconnect disposed in the ILD along a fourth track, wherein the fourth interconnect has the first height, wherein the fourth interconnect is laterally between the second interconnect and the third interconnect;
a fifth interconnect disposed in the ILD along a fifth track, wherein the fifth track has the second height, wherein the fifth interconnect is adjacent to a side of the third interconnect opposite the fourth interconnect, and wherein each of the first interconnect, the second interconnect, the third interconnect, the fourth interconnect, and the fifth interconnect has a bottommost surface above a bottommost surface of the ILD; and
a via through the ILD, the via laterally between the third interconnect and the fourth interconnect.

9. The semiconductor device of claim 8, wherein a first interconnect layer and a second interconnect layer both comprise the first interconnect and the second interconnect.

10. The semiconductor device of claim 9, wherein the first interconnect layer is directly below the second interconnect layer.

11. The semiconductor device of claim 8, wherein the first interconnect layer is spaced apart from the second interconnect layer by one or more intervening interconnect layers.

12. The semiconductor device of claim 8, wherein at least one of the plurality of interconnect layers comprises interconnects with a uniform height.

13. An electronic system, comprising:
a board; and
an electronic package electrically coupled to the board, wherein the electronic package comprises a semiconductor die, and wherein the die comprises:
an interconnect layer with first interconnects, second interconnects, third interconnect, fourth interconnects, and fifth interconnects in an interlayer dielectric (ILD) along corresponding tracks, wherein a height of the second interconnects is less than a height of the first interconnects, wherein a height of the third interconnects is between the height of the first interconnects and the height of the second interconnects, wherein the fourth interconnects have the height of the first interconnects, wherein the fifth interconnects have the height of the second interconnects, wherein one of the second interconnects is laterally between one of the third interconnects and one of the first interconnects, wherein one of the fourth interconnects is laterally between the one of the second interconnects and the one of the third interconnects, wherein one of the fifth interconnects is adjacent to a side of the one of the third interconnects opposite the one of the fourth interconnects, and wherein each of the first interconnects, the second interconnects, the third interconnects, the fourth interconnects, and the fifth interconnects has a bottommost surface above a bottommost surface of the ILD, and the interconnect layer further comprising a via through the ILD, the via laterally between the one of the third interconnects and the one of the fourth interconnects.

14. The electronic system of claim 13, wherein the interconnect layer further comprises a first etchstop layer and a second etchstop layer within the ILD.

15. A method of forming an interconnect layer, comprising:
disposing a grating over an interlayer dielectric (ILD);
forming first trenches into the ILD through the grating along a first track, wherein the first trenches have a first depth;
forming second trenches into the ILD along a second track, wherein the second trenches have a second depth that is less than the first depth;
forming third trenches into the ILD along a third track, wherein the third trenches have a third depth that is between the first depth and the second depth;
forming fourth trenches into the ILD along a fourth track, wherein the fourth trenches have the first depth, wherein one of the second trenches is laterally between one of the third trenches and one of the first trenches, wherein one of the fourth trenches is laterally between the one of the second trenches and the one of the third trenches;
forming fifth trenches into the ILD along a fifth track, wherein the fifth trenches have the second depth, wherein one of the fifth trenches is adjacent to a side of the one of the third trenches opposite the one of the fourth trenches, and wherein each of the first trenches, the second trenches, the third trenches, the fourth trenches, and the fifth trenches has a bottommost surface above a bottommost surface of the ILD; and
forming a via through the ILD, the via laterally between the one of the third trenches and the one of the fourth trenches.

16. The method of claim 15, further comprising:
covering one or more openings in the grating before forming the first trenches;
and covering the first trenches before forming the second trenches.

17. The method of claim 15, wherein the first trenches are formed at all locations exposed by the grating, and wherein the method further comprises covering one or more of the first trenches, wherein the second trenches are formed at locations of exposed first trenches.

18. The method of claim 15, further comprising:
   forming a via through a bottom of a first trench or through a bottom of a second trench.

* * * * *